United States Patent
Lin et al.

(10) Patent No.: US 10,032,756 B2
(45) Date of Patent: Jul. 24, 2018

(54) SEMICONDUCTOR PACKAGE ASSEMBLY WITH FACING ACTIVE SURFACES OF FIRST AND SECOND SEMICONDUCTOR DIE AND METHOD FOR FORMING THE SAME

(71) Applicant: MediaTek Inc., Hsin-Chu (TW)

(72) Inventors: Tzu-Hung Lin, Zhubei (TW);
Ching-Wen Hsiao, Hsinchu (TW);
I-Hsuan Peng, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/071,573

(22) Filed: Mar. 16, 2016

(65) Prior Publication Data

US 2016/0343695 A1   Nov. 24, 2016

Related U.S. Application Data

(60) Provisional application No. 62/164,725, filed on May 21, 2015, provisional application No. 62/198,865, filed on Jul. 30, 2015.

(51) Int. Cl.
*H01L 25/16* (2006.01)
*H01L 23/532* (2006.01)
(Continued)

(52) U.S. Cl.
CPC ............ *H01L 25/16* (2013.01); *H01L 21/563* (2013.01); *H01L 21/565* (2013.01);
(Continued)

(58) Field of Classification Search
CPC ....... H01L 25/16; H01L 25/50; H01L 25/105; H01L 23/3114; H01L 23/5226;
(Continued)

(56) References Cited

U.S. PATENT DOCUMENTS

| 8,455,936 B2 | 6/2013 | O'Neill |
| 2005/0191770 A1* | 9/2005 | Schieck ............. G01R 31/2884 438/14 |

(Continued)

FOREIGN PATENT DOCUMENTS

| CN | 104505382 | 4/2015 |
| FR | 2 980 036 | 3/2013 |

(Continued)

*Primary Examiner* — Peniel M Gumedzoe
(74) *Attorney, Agent, or Firm* — Wolf, Greenfield & Sacks, P.C.

(57) ABSTRACT

A semiconductor package assembly is provided. The semiconductor package assembly includes a first semiconductor package. The first semiconductor package includes a first semiconductor die. A first redistribution layer (RDL) structure is coupled to the first semiconductor die and includes a first conductive trace. The semiconductor package assembly also includes a second semiconductor package bonded to the first semiconductor package. The second semiconductor package includes a second semiconductor die. An active surface of the second semiconductor die faces an active surface of the first semiconductor die. A second RDL structure is coupled to the second semiconductor die and includes a second conductive trace. The first conductive trace is in direct contact with the second conductive trace.

22 Claims, 13 Drawing Sheets

(51) Int. Cl.
| | | |
|---|---|---|
| *H01L 23/31* | (2006.01) | |
| *H01L 23/522* | (2006.01) | |
| *H01L 21/78* | (2006.01) | |
| *H01L 25/00* | (2006.01) | |
| *H01L 21/768* | (2006.01) | |
| *H01L 21/56* | (2006.01) | |
| *H01L 21/683* | (2006.01) | |
| *H01L 23/00* | (2006.01) | |
| *H01L 23/528* | (2006.01) | |
| *H01L 23/538* | (2006.01) | |
| *H01L 25/10* | (2006.01) | |
| *H01L 23/498* | (2006.01) | |

(52) U.S. Cl.
CPC .... *H01L 21/6835* (2013.01); *H01L 21/76802* (2013.01); *H01L 21/76879* (2013.01); *H01L 21/78* (2013.01); *H01L 23/3114* (2013.01); *H01L 23/528* (2013.01); *H01L 23/5226* (2013.01); *H01L 23/5385* (2013.01); *H01L 23/5389* (2013.01); *H01L 23/53228* (2013.01); *H01L 24/03* (2013.01); *H01L 24/09* (2013.01); *H01L 24/11* (2013.01); *H01L 24/17* (2013.01); *H01L 24/19* (2013.01); *H01L 24/20* (2013.01); *H01L 24/73* (2013.01); *H01L 24/80* (2013.01); *H01L 24/89* (2013.01); *H01L 24/92* (2013.01); *H01L 24/96* (2013.01); *H01L 25/105* (2013.01); *H01L 25/50* (2013.01); *H01L 21/561* (2013.01); *H01L 21/568* (2013.01); *H01L 23/49811* (2013.01); *H01L 24/05* (2013.01); *H01L 24/13* (2013.01); *H01L 2224/02317* (2013.01); *H01L 2224/02319* (2013.01); *H01L 2224/02331* (2013.01); *H01L 2224/02371* (2013.01); *H01L 2224/02372* (2013.01); *H01L 2224/02379* (2013.01); *H01L 2224/03002* (2013.01); *H01L 2224/04105* (2013.01); *H01L 2224/05548* (2013.01); *H01L 2224/05567* (2013.01); *H01L 2224/05571* (2013.01); *H01L 2224/05647* (2013.01); *H01L 2224/08147* (2013.01); *H01L 2224/12105* (2013.01); *H01L 2224/131* (2013.01); *H01L 2224/13022* (2013.01); *H01L 2224/13024* (2013.01); *H01L 2224/73259* (2013.01); *H01L 2224/802* (2013.01); *H01L 2224/80003* (2013.01); *H01L 2224/80006* (2013.01); *H01L 2224/8083* (2013.01); *H01L 2224/80895* (2013.01); *H01L 2224/80896* (2013.01); *H01L 2224/9202* (2013.01); *H01L 2224/96* (2013.01); *H01L 2924/1205* (2013.01); *H01L 2924/1206* (2013.01); *H01L 2924/1207* (2013.01); *H01L 2924/1431* (2013.01); *H01L 2924/1432* (2013.01); *H01L 2924/1436* (2013.01); *H01L 2924/18162* (2013.01); *H01L 2924/19011* (2013.01); *H01L 2924/19041* (2013.01); *H01L 2924/19042* (2013.01); *H01L 2924/19043* (2013.01); *H01L 2924/19105* (2013.01); *H01L 2924/37001* (2013.01)

(58) Field of Classification Search
CPC ............. H01L 23/528; H01L 23/53228; H01L 23/5385; H01L 23/5389
See application file for complete search history.

(56) References Cited

U.S. PATENT DOCUMENTS

| | | |
|---|---|---|
| 2008/0237883 A1 | 10/2008 | Tago et al. |
| 2010/0044845 A1 | 2/2010 | Funaya et al. |
| 2011/0037169 A1 | 2/2011 | Pagaila |
| 2011/0133339 A1* | 6/2011 | Wang ............... H01L 21/76898 257/773 |
| 2011/0147911 A1 | 6/2011 | Kohl et al. |
| 2011/0278732 A1* | 11/2011 | Yu ........................ H01L 23/481 257/774 |
| 2013/0037950 A1 | 2/2013 | Yu et al. |
| 2014/0252647 A1 | 9/2014 | Huang et al. |
| 2014/0339704 A1* | 11/2014 | Ahn ................... H01L 25/0657 257/773 |
| 2015/0162220 A1 | 6/2015 | Chou et al. |
| 2016/0322330 A1* | 11/2016 | Lin .................... H01L 25/0652 |

FOREIGN PATENT DOCUMENTS

| | | |
|---|---|---|
| JP | 2010219477 | 9/2010 |
| JP | 2010238898 | 10/2010 |
| TW | 201432871 | 8/2014 |

\* cited by examiner

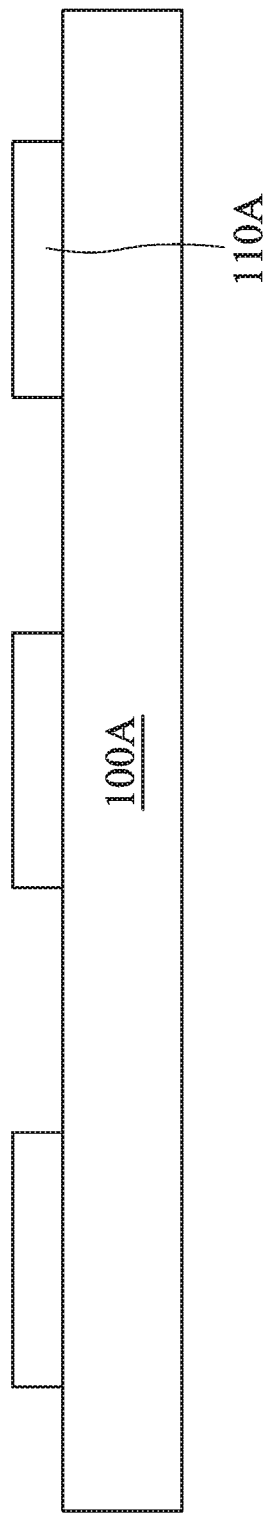

SEMICONDUCTOR PACKAGE ASSEMBLY WITH FACING ACTIVE SURFACES OF FIRST AND SECOND SEMICONDUCTOR DIE AND METHOD FOR FORMING THE SAME

CROSS REFERENCE TO RELATED APPLICATIONS

This Application claims the benefit of U.S. Provisional Application No. 62/164,725 filed on May 21, 2015, and U.S. Provisional Application No. 62/198,865 filed on Jul. 30, 2015, the entirety of which are incorporated by reference herein.

BACKGROUND OF THE INVENTION

Field of the Invention

The present invention relates to a semiconductor package assembly, and in particular to a three-dimensional (3D) semiconductor package assembly and methods for forming the same.

Description of the Related Art

The semiconductor industry has experienced continuous and rapid growth due to the desire for miniaturization and multi-functionality of electronic products. Integration density has been improved to allow more chips or dies to be integrated into a semiconductor package, such as a two-dimensional (2D) semiconductor package. However, there are physical limitations to 2D semiconductor packages. For example, when more than two dies with various functions are put into a 2D semiconductor device, it becomes more difficult to develop the more complex designs and layouts that are required.

Although 3D integrated circuits and stacked dies have been developed and are commonly used, the dies integrated into a conventional 3D semiconductor package are limited to be the same size. Furthermore, 3D semiconductor packaging technology suffers from various problems that may cause a reduction of the manufacturing yield.

Thus, there exists a need to develop a semiconductor package assembly, and methods for forming the same, capable of mitigating or eliminating the aforementioned problems.

BRIEF SUMMARY OF THE INVENTION

A semiconductor package assembly and a method for forming a semiconductor package assembly are provided.

An exemplary embodiment of a semiconductor package assembly includes a first semiconductor package. The first semiconductor package includes a first semiconductor die. A first redistribution layer (RDL) structure is coupled to the first semiconductor die and includes a first conductive trace. The semiconductor package assembly also includes a second semiconductor package bonded to the first semiconductor package. The second semiconductor package includes a second semiconductor die. An active surface of the second semiconductor die faces an active surface of the first semiconductor die. A second RDL structure is coupled to the second semiconductor die and includes a second conductive trace. The first conductive trace is in direct contact with the second conductive trace.

Another exemplary embodiment of a semiconductor package assembly includes a first package. The first package includes a first component. A first RDL structure is coupled to the first component and includes a first conductive trace. The semiconductor package assembly also includes a second package bonded to the first package. The second package includes a second component. A second RDL structure is coupled to the second component and includes a second conductive trace. The first conductive trace is in direct contact with the second conductive trace.

An exemplary embodiment of a method for forming a semiconductor package assembly includes forming a first semiconductor package. The first semiconductor package includes a first semiconductor die. A first RDL structure is coupled to the first semiconductor die and includes a first conductive trace. The method also includes forming a second semiconductor package. The second semiconductor package includes a second semiconductor die. An active surface of the second semiconductor die faces an active surface of the first semiconductor die. A second RDL structure is coupled to the second semiconductor die and includes a second conductive trace. The method further includes bonding the second semiconductor package to the first semiconductor package. The first conductive trace is in direct contact with the second conductive trace.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 1A-1C are cross-sectional views of various stages of a method for forming a semiconductor package, in accordance with some embodiments of the disclosure.

DETAILED DESCRIPTION OF THE INVENTION

Figure 1B:
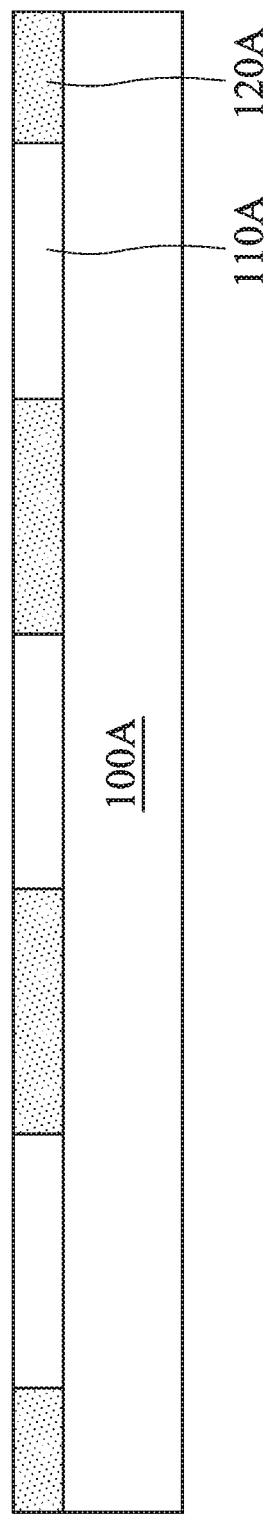

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments of the disclosure provide a 3D system-in-package (SIP) semiconductor package assembly. The semiconductor package assembly is integrated with more than two components or dies so that the size of electronic products made using the semiconductor package assembly can be reduced. These components or dies are separately fabricated and are subsequently integrated into the semiconductor package assembly. As a result, their sizes and/or functions are not limited to be the same. The design flexibility of the semiconductor package assembly is greatly improved. Furthermore, these components or dies are tested in advance to make sure that the semiconductor package assembly only includes good components or dies. As a result, the yield loss resulted from multiple defective components or dies is significantly mitigated or eliminated. Therefore, the manufacturing cost of the semiconductor package assembly is reduced.

Figure 1C:
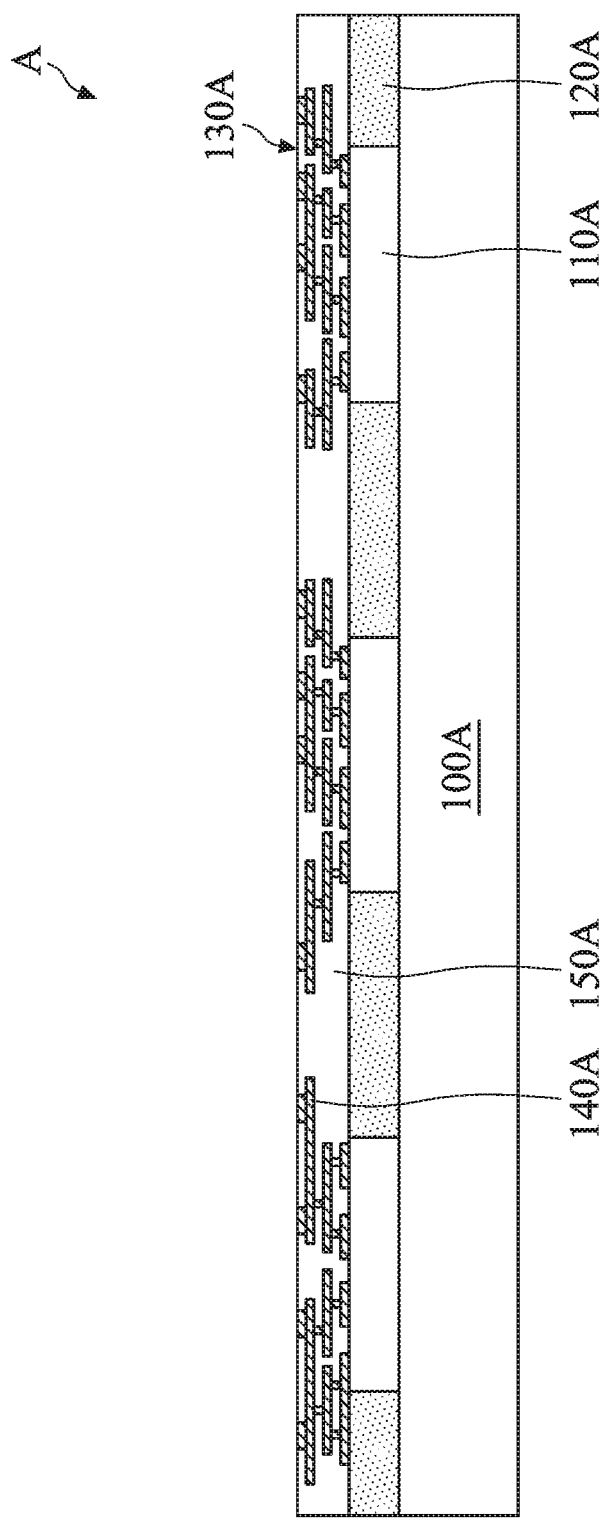

FIGS. 1A-1C are cross-sectional views of various stages of a method for forming a semiconductor package, in accordance with some embodiments of the disclosure. Additional operations can be provided before, during, and/or after the stages described in FIGS. 1A-1C. Some of the stages that are described can be replaced or eliminated for different embodiments. Additional features can be added to the semiconductor package. Some of the features described below can be replaced or eliminated for different embodiments.

As shown in FIG. 1A, a first carrier substrate 100A is provided. In some embodiments, the first carrier substrate 100A is a wafer or a panel. The first carrier substrate 100A may include glass or another suitable supporting material.

As shown in FIG. 1A, multiple first components 110A are bonded onto the first carrier substrate 100A. In accordance with some embodiments of the disclosure, the first components 110A are known-good components. In other words, no defective components are bonded onto the first carrier substrate 100A. In some embodiments, the first components 110A and the first carrier substrate 100A are attached together through an adhesive layer such as glue or another suitable adhesive material.

In some embodiments, the first components 110A are active devices and can be referred to as first semiconductor dies (or chips) 110A. The first semiconductor dies 110A may include transistors or another suitable active element. For example, the first semiconductor dies 110A may be a logic die including a central processing unit (CPU), a graphics processing unit (GPU), a dynamic random access memory (DRAM) controller or any combination thereof. In some other embodiments, the first components 110A are passive devices such as integrated passive devices (IPDs). The first components 110A may include capacitors, resistors, inductors, varactor diodes or another suitable passive element.

As shown in FIG. 1B, a first molding compound 120A is formed on the first carrier substrate 100A. The first molding compound 120A surrounds the sidewalls of the first components 110A without covering the top and bottom surfaces of the first components 110A.

In some embodiments, the first molding compound 120A is formed of a nonconductive material such as an epoxy, a resin, a moldable polymer, or another suitable molding material. In some embodiments, the first molding compound 120A is applied as a substantial liquid, and then is cured through a chemical reaction. In some other embodiments, the first molding compound 120A is an ultraviolet (UV) or thermally cured polymer applied as a gel or malleable solid, and then is cured through a UV or thermal curing process. The first molding compound 120A may be cured with a mold.

In some embodiments, the deposited first molding compound 120A covers the top surfaces of the first components 110A, and then a grinding process is performed to thin the deposited first molding compound 120A. As a result, the thinned first molding compound 120A exposes the top surfaces of the first components 110A. In some embodiments, the top and bottom surfaces of the first molding compound 120A are coplanar with the top and bottom surfaces of the first components 110A, respectively.

As shown in FIG. 1C, a first redistribution layer (RDL) structure 130A, which is also referred to as a fan-out structure, is formed on the first molding compound 120A and is coupled to the first components 110A. As a result, a first (semiconductor) package A is formed. In some embodiments, the first (semiconductor) package A is a wafer-level fan-out package.

The first RDL structure 130A covers the first molding compound 120A and may be in direct contact with the first molding compound 120A. In some embodiments, the first RDL structure 130A includes one or more conductive traces 140A disposed in and surrounded by an inter-metal dielectric (IMD) layer 150A. The first components 110A are electrically connected to the conductive traces 140A of the first RDL structure 130A. The IMD layer 150A may include multiple sub-dielectric layers successively stacked on the first molding compound 120A and the first components 110A. For example, a first layer-level of the conductive traces 140A is positioned on a first layer-level of the sub-dielectric layers and covered by a second layer-level of the sub-dielectric layers. A second layer-level of the conductive traces 140A is positioned on the second layer-level of the sub-dielectric layers and covered by a third layer-level of the sub-dielectric layers.

In some embodiments, the IMD layer 150A may be formed of organic materials, which include a polymer base material, non-organic materials, which include silicon nitride ($SiN_X$), silicon oxide ($SiO_X$), graphene, or the like. In some embodiments, the IMD layer 150A is a high-k dielectric layer (k is the dielectric constant of the dielectric layer). In some other embodiments, the IMD layer 150A may be formed of a photosensitive material, which includes a dry film photoresist, or a taping film.

Pad portions of the conductive traces 140A are exposed from the top surface of the first RDL structure 130A. For example, the pad portions of the conductive traces 140A are exposed from openings of the IMD layer 150A and connected to subsequently formed conductive components. It should be noted that the number and configuration of the conductive trace 140A and the IMD layer 150A shown in figures are only examples and are not limitations to the present invention. In some embodiments, the conductive traces 140A include copper, or another suitable conductive material with good diffusibility.

Figure 2A:
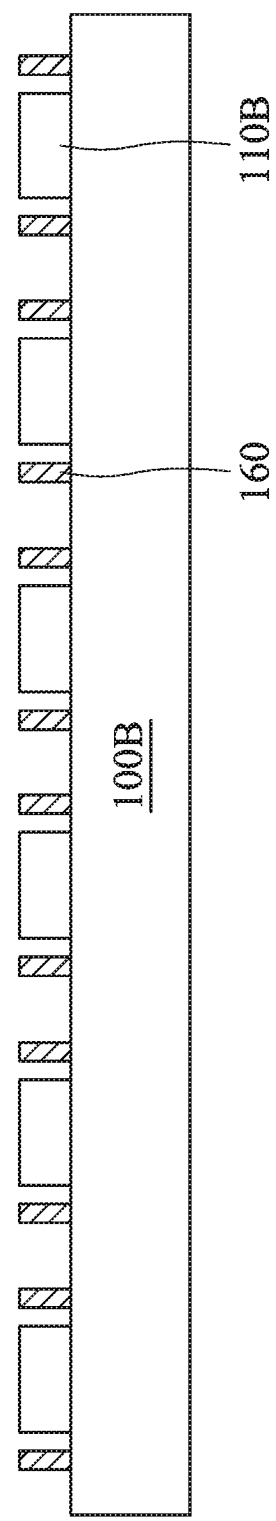
FIGS. 2A-2C are cross-sectional views of various stages of a method for forming a semiconductor package, in accordance with some embodiments of the disclosure.
Figure 2B:
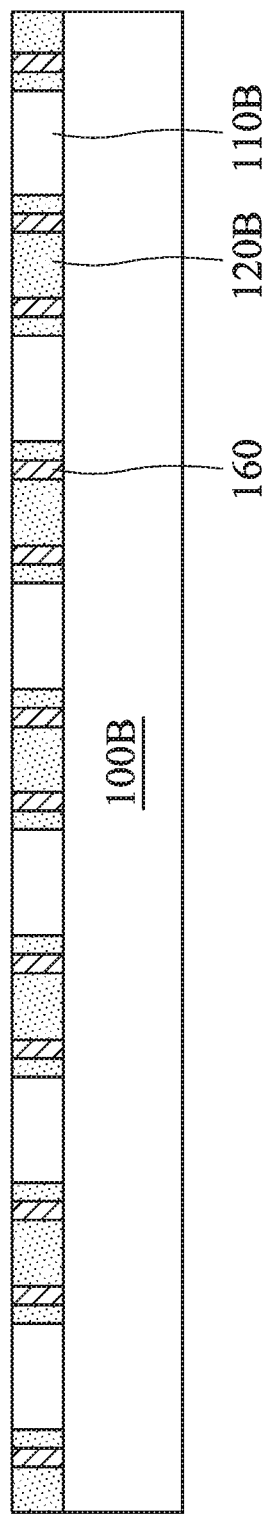
Figure 2C:
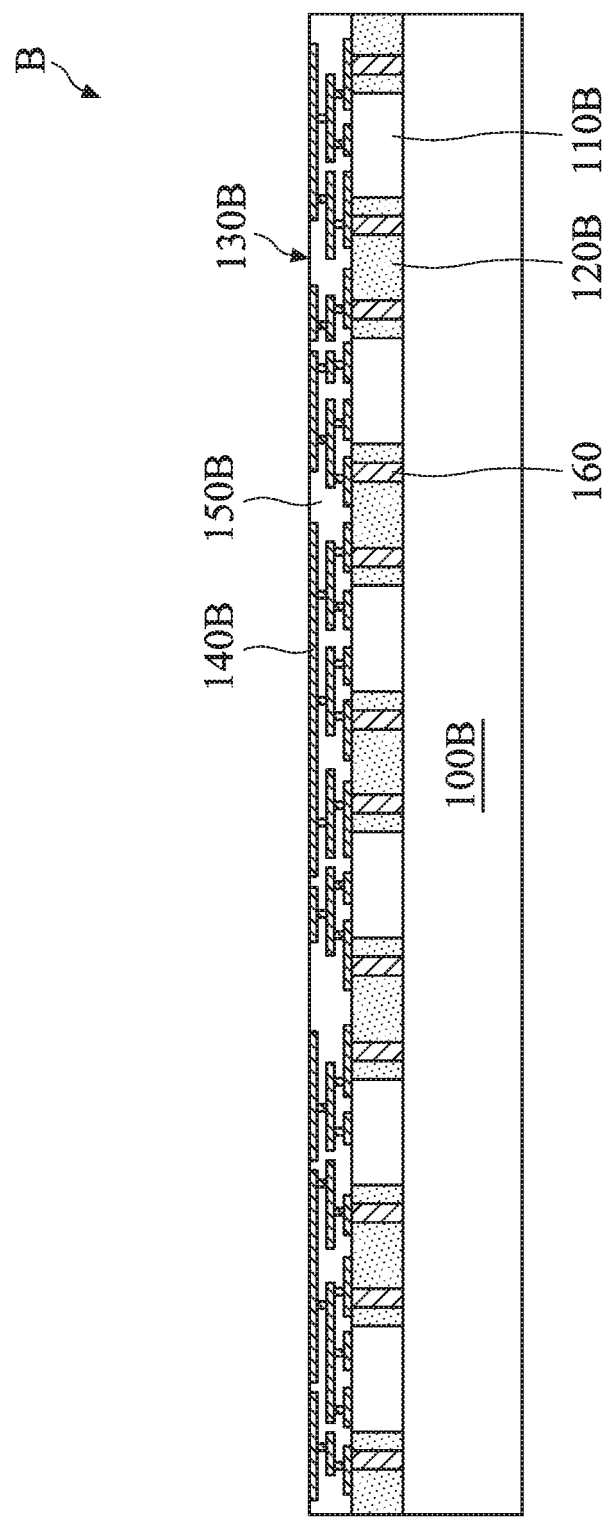

FIGS. 2A-2C are cross-sectional views of various stages of a method for forming a semiconductor package, in accordance with some embodiments of the disclosure. Additional operations can be provided before, during, and/or after the stages described in FIGS. 2A-2C. Some of the stages that are described can be replaced or eliminated for different embodiments. Additional features can be added to the semiconductor package. Some of the features described below can be replaced or eliminated for different embodiments.

As shown in FIG. 2A, a second carrier substrate 100B is provided. In some embodiments, the second carrier substrate 100B is a wafer or a panel. The second carrier substrate 100B may include glass, or another suitable supporting material.

As shown in FIG. 2A, multiple vias 160 are formed on the second carrier substrate 100B. The vias 160 may be through interposer vias (TIV). In some embodiments, the vias 160 are copper pillars or other suitable conductive structures. In some embodiments, the vias 160 are formed by an electroplating process or another suitable process.

As shown in FIG. 2A, multiple second components 110B are bonded onto the second carrier substrate 100B. In accordance with some embodiments of the disclosure, the second components 110B are known-good components. In other words, no defective components are bonded onto the second carrier substrate 100B. In some embodiments, the second components 110B and the second carrier substrate 100B are attached together through an adhesive layer such as glue or another suitable adhesive material. In some embodiments, each of the second components 110B is positioned between two of the vias 160. In some embodiments, one or more vias 160 are positioned between two of the second components 110B.

In some embodiments, the second components 110B are active devices and can be referred to as second semiconductor dies (or chips) 110B. The second semiconductor dies 110B may include transistors or other suitable active elements. For example, the second semiconductor dies 110B may be a logic die including a CPU, a GPU, a DRAM controller or any combination thereof. In some other embodiments, the second components 110B are passive devices such as IPDs. The second components 110B may include capacitors, resistors, inductors, varactor diodes, and other suitable passive elements.

As shown in FIG. 2B, a second molding compound 120B is formed on the second carrier substrate 100B. The second molding compound 120B surrounds the vias 160 and the sidewalls of the second components 110B without covering the top and bottom surfaces of the second components 110B and the vias 160. Namely, the vias 160 penetrate or pass through the second molding compound 120B.

In some embodiments, the second molding compound 120B is formed of a nonconductive material such as an epoxy, a resin, a moldable polymer, or another suitable molding material. In some embodiments, the second molding compound 120B is applied as a substantial liquid, and then is cured through a chemical reaction. In some other embodiments, the second molding compound 120B is an UV or thermally cured polymer applied as a gel or malleable solid, and then is cured through a UV or thermal curing process. The second molding compound 120B may be cured with a mold.

In some embodiments, the deposited second molding compound 120B covers the top surfaces of the second components 110B and the vias 160, and then a grinding process is performed to thin the deposited second molding compound 120B. As a result, the thinned second molding compound 120B exposes the top surfaces of the second components 110B and the vias 160. In some embodiments, the top and bottom surfaces of the second molding compound 120B are coplanar with the top and bottom surfaces of the second components 110B, respectively. In some embodiments, the top and bottom surfaces of the second molding compound 120B are coplanar with the top and bottom surfaces of the vias 160, respectively.

In accordance with some embodiments of the disclosure, the second components 110B are previously thinned before being bonded onto the second carrier substrate 100B. As a result, the second components 110B and the vias 160 substantially have the same thickness and thereby facilitating the exposure of the second components 110B and the vias 160. For example, a semiconductor wafer is thinned and is subsequently diced into semiconductor dies (or chips) to form the second components 110B. The second components 110B may be thinned by a mechanical grinding process, a chemical mechanical polishing process, a milling process or another suitable process.

As shown in FIG. 2C, a second RDL structure 130B is formed on the second molding compound 120B and is coupled to the second components 110B and the vias 160. As a result, a second (semiconductor) package B is formed. In some embodiments, the second (semiconductor) package B is a wafer-level fan-out package. The second RDL structure 130B covers the second molding compound 120B and may be in direct contact with the second molding compound 120B. In some embodiments, the second RDL structure 130B includes one or more conductive traces 140B disposed in and surrounded by an IMD layer 150B. The second components 110B are electrically connected to the conductive traces 140B of the second RDL structure 130B. Pad portions of the conductive traces 140B are exposed from the top surface of the second RDL structure 130B. The structure of the second RDL structure 130B may be similar to or the same as the structure of the first RDL structure 130A, as aforementioned in detail. It should be noted that the number and configuration of the conductive trace 140B and the IMD layer 150B shown in figures are only examples and are not limitations to the present invention. In some embodiments, the conductive traces 140B include copper, or another suitable conductive material with good diffusibility.

FIGS. 3A-3E are cross-sectional views of various stages of a method for forming a semiconductor package assembly, in accordance with some embodiments of the disclosure. Additional operations can be provided before, during, and/or after the stages described in FIGS. 3A-3E. Some of the stages that are described can be replaced or eliminated for different embodiments. Additional features can be added to the semiconductor package assembly. Some of the features described below can be replaced or eliminated for different embodiments.

Figure 3A:
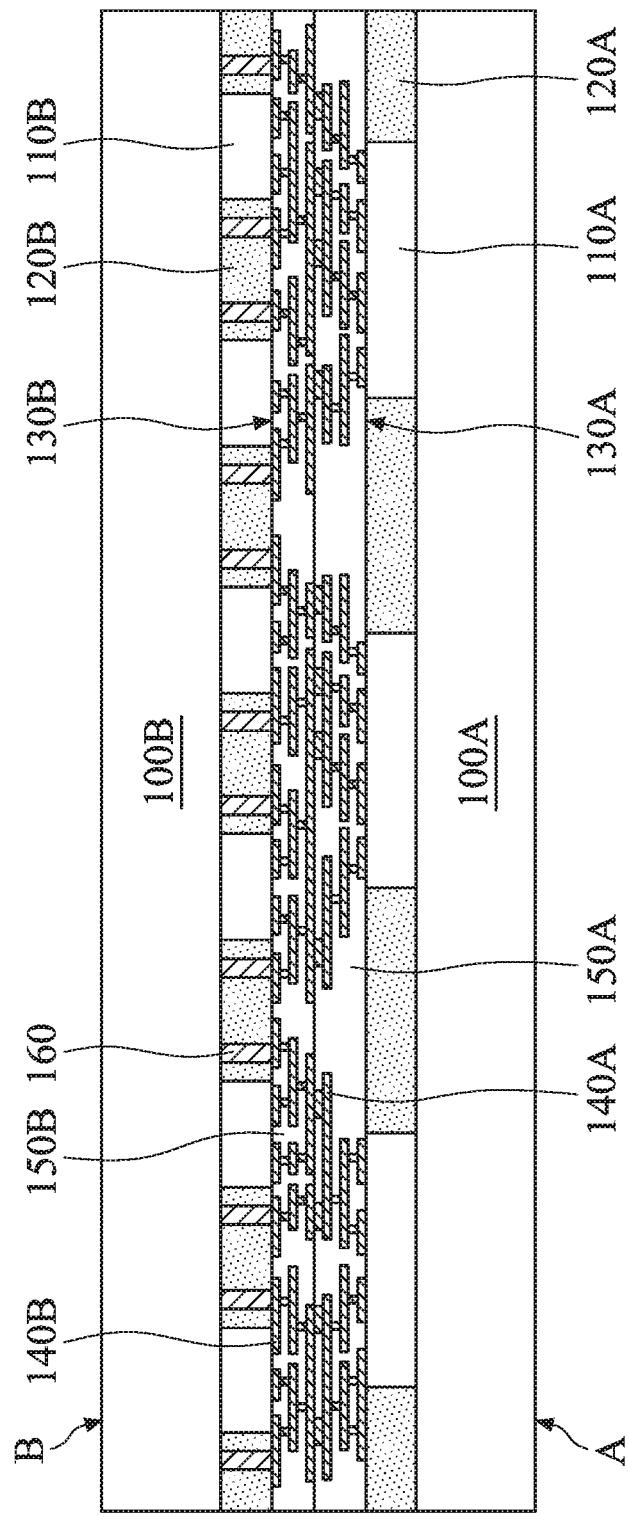
FIGS. 3A-3E are cross-sectional views of various stages of a method for forming a semiconductor package assembly, in accordance with some embodiments of the disclosure.

As shown in FIG. 3A, the second package B is bonded to the first package A so that the first RDL structure 130A is sandwiched between the first components 110A and the second RDL structure 130B. The conductive traces 140A of the first RDL structure 130A are directly electrically connected to the conductive traces 140B of the second RDL structure 130B. For example, the pad portions of the conductive traces 140A and 140B are in direct contact with each other. The IMD layer 150A of the first RDL structure 130A and the IMD layer 150B of the second RDL structure 130B are also in direct contact with each other. In some embodiments, an active surface of the first component 110A faces an active surface of the second component 110B.

In accordance with some embodiments of the disclosure, the first package A and the second package B are bonded together using a fusion bonding method. In some embodiments, the first package A and the second package B are bonded together using a copper fusion bonding method. For example, the conductive traces 140A and 140B include copper so that the first package A and the second package B are bonded together through copper joints. The joints between the first package A and the second package B do not include solder.

The second package B is placed on the first package A. The conductive traces 140A directly adjoin the conductive traces 140B. In some embodiments, the conductive traces 140A substantially align to the conductive traces 140B. In some embodiments, the conductive traces 140A and the conductive traces 140B have the same layout. The conductive traces 140A substantially completely overlap the conductive traces 140B. In some other embodiments, the conductive traces 140A and the conductive traces 140B have different layouts. The conductive traces 140A at least partially overlap the conductive traces 140B so as to build electrical connection paths between the first package A and the second package B.

Afterwards, a thermal treatment is performed over the first package A and the second package B. As a result, the fusion of metal (copper) in the conductive traces 140A and the conductive traces 140B makes the second package B connect with the first package A. The conductive traces 140A directly connect to the conductive traces 140B without a bonding structure (such as a conductive pillar, a conductive bump, or a conductive paste structure). In some embodiments, the thermal treatment is performed at a temperature that is in a range from about 150 degrees C. to about 250 degrees C., but it is not so limited.

In some embodiments, during the thermal treatment, ultrasonic energy is applied to the first package A and the second package B. The ultrasonic energy facilitates metal diffusion between the conductive traces 140A and the conductive traces 140B. Therefore, the joints between the first package A and the second package B are strengthened so that the first package A and the second package B are tightly bonded together.

In some embodiments, before placing the second package B on the first package A, a planarization process is performed over the first package A and/or the second package B. The planarization process is used to reduce surface roughness and provide the first package A and/or the second package B with a flat and even bonding surface. For example, the surface of the first RDL structure 130A and/or the second RDL structure 130B has previously been planarized before placing the second package B on the first package A. Therefore, the second package B can be bonded to the first package A intimately.

Figure 3B:
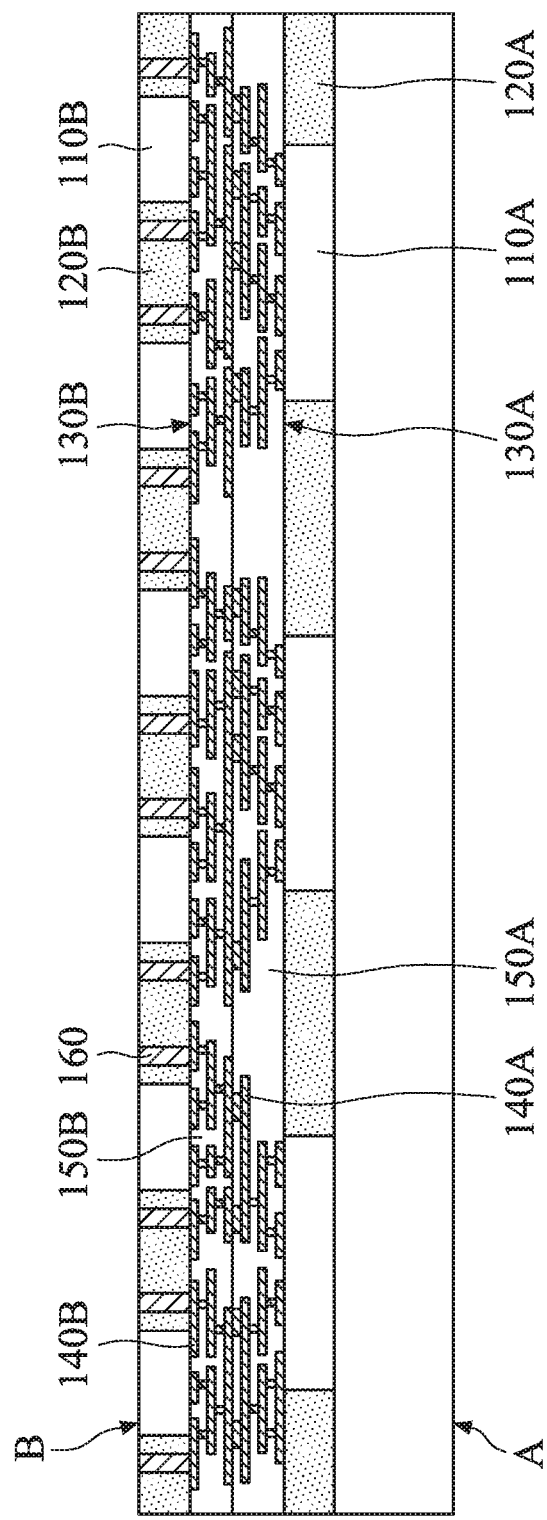

As shown in FIG. 3B, the second carrier substrate 100B is removed from the second package B. As a result, the second components 110B and the vias 160 are exposed. The sidewalls of the second components 110B and the vias 160 are still surrounded by the second molding compound 120B. In some embodiments, the adhesive property of the adhesive layer, which is used to bond the second components 110B and the second carrier substrate 100B, is eliminated to debond the second carrier substrate 100B.

Figure 3C:
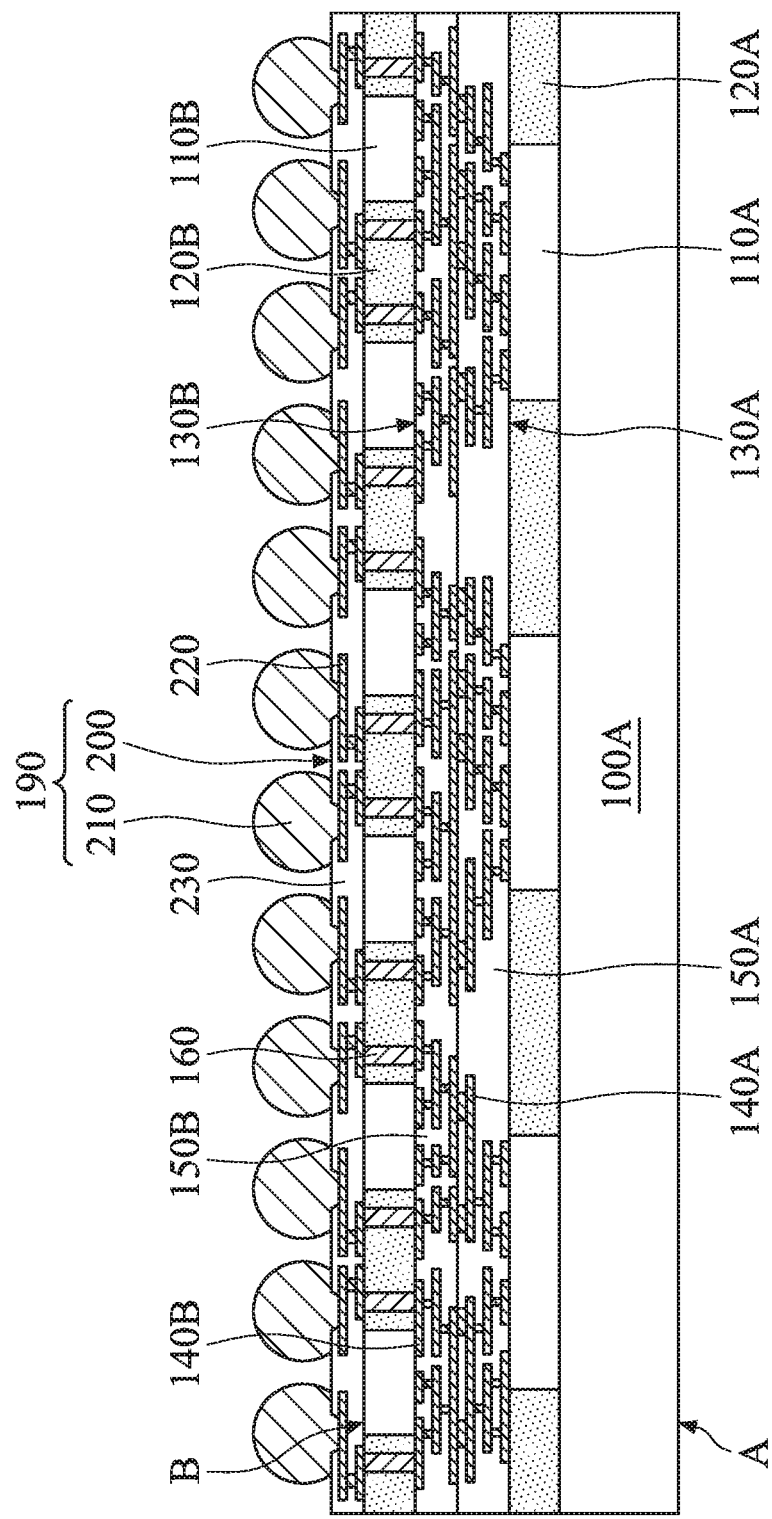

As shown in FIG. 3C, a conductive component 190 is formed on the second package B away from the first package A. In other words, the conductive component 190 and the first package A are positioned on two opposite sides of the second package B. The second components 110B are positioned between the second RDL structure 130B and the conductive component 190.

In some embodiments, the conductive component 190 is electrically connected or coupled to the second components 110B through the vias 160 and the second RDL structure 130B. In some embodiments, the conductive component 190 is further electrically connected to the first components 110A through the vias 160, the second RDL structure 130B, and the first RDL structure 130A.

In some embodiments, the conductive component 190 is formed of a RDL structure 200 and conductive structures 210 over the RDL structure 200. In some embodiments, the RDL structure 200 includes one or more conductive traces 220 disposed in and surrounded by an IMD layer 230. Pad portions of the conductive traces 220 are exposed from the top surface of the RDL structure 200. The structure of the RDL structure 200 may be similar to or the same as the structure of the first RDL structure 130A, as aforementioned in detail.

The conductive structures 210 are electrically connected to the exposed pad portions of the conductive traces 220. The vias 160 are electrically connected or coupled to the conductive structures 210 through the conductive traces 220. In some embodiments, the conductive structures 210 are bonding balls (such as solder balls), or another suitable conductive structures. It should be noted that the number and configuration of the conductive structures 210 and the conductive traces 220 shown in figures are only examples and are not limitations to the present invention.

In some other embodiments, the conductive component 190 is formed of the conductive structures 210. The vias 160 are directly electrically connected to the conductive structures 210. The vias 160 may be electrically connected to the conductive structures 210 through one or more conductive layers, such as under bump metallization (UBM) layers.

Figure 3D:
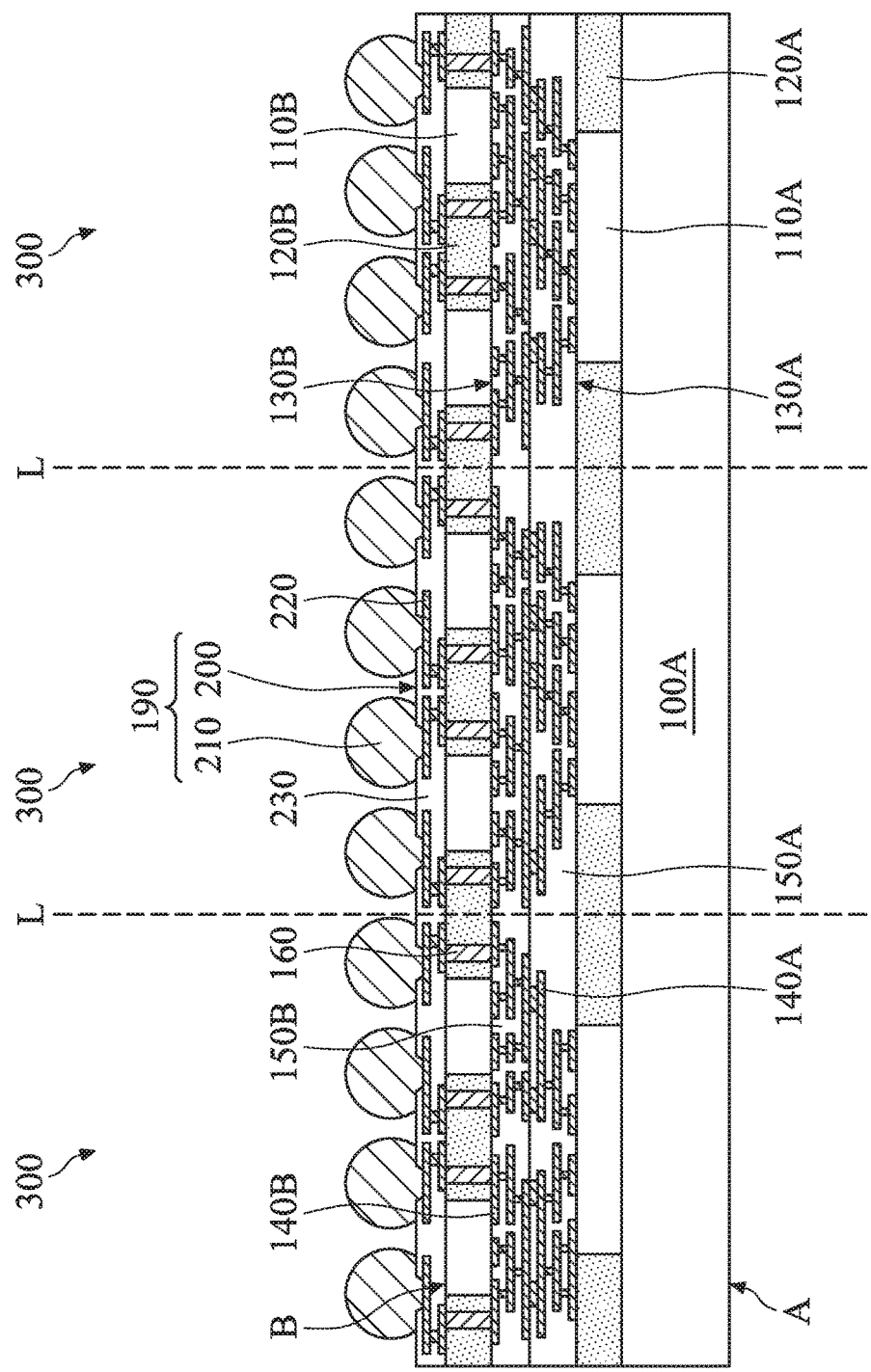

As shown in FIG. 3D, the first carrier substrate 100A is removed from the first package A. As a result, the first components 110A are exposed. The sidewalls of the first components 110A are still surrounded by the first molding compound 120A. In some embodiments, the adhesive property of the adhesive layer, which is used to bond the first components 110A and the first carrier substrate 100A, is eliminated to debond the first carrier substrate 100A.

Afterwards, a singulation process is performed on the bonded packages A and B. The bonded packages A and B are cut or diced along scribe lines L to separate the bonded packages A and B into multiple semiconductor package assemblies 300. The semiconductor package assemblies 300 are SIP semiconductor package assemblies and wafer-level fan-out packages are integrated in the semiconductor package assemblies 300.

Figure 3E:
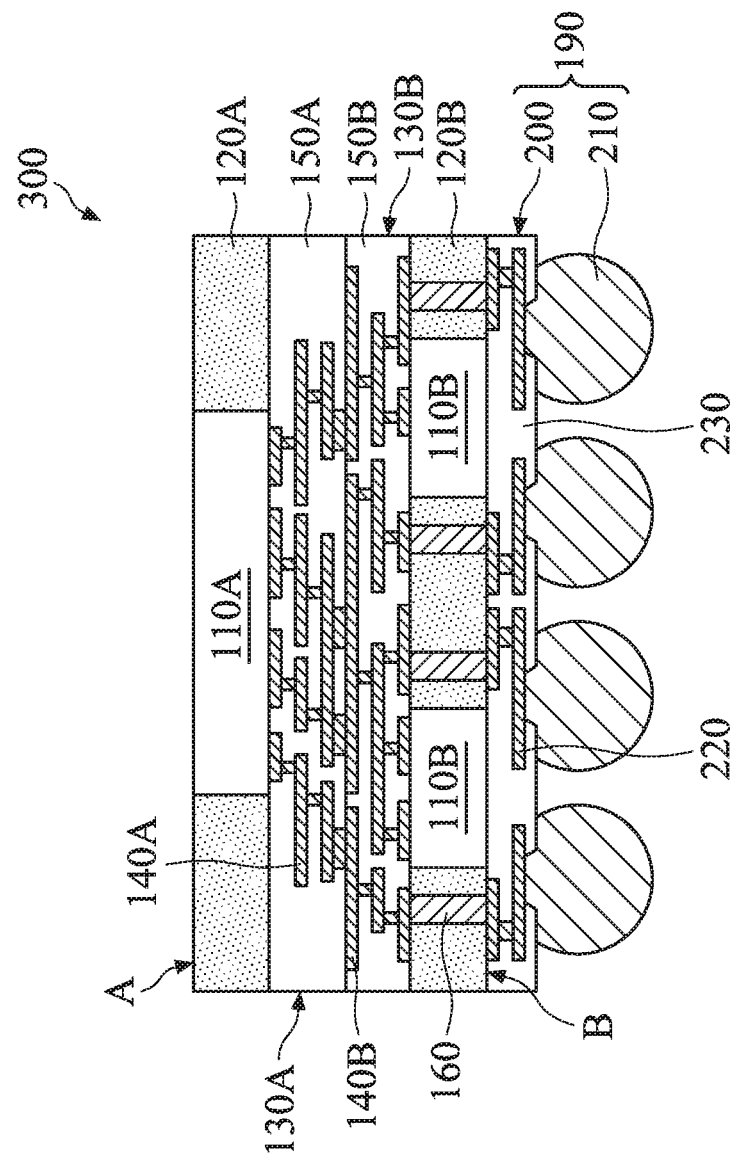

As shown in FIG. 3E, each of the semiconductor package assemblies 300 includes one first component 110A and two second components 110B. The semiconductor package assembly 300 may include more than two second components 110B. In some embodiments, the size of the first component 110A is different from that of the second components 110B. For example, the size of the first component 110A is greater than that of the second components 110B. In some embodiments, the second components 110B are the same size. In some other embodiments, the second components 110B are different sizes.

In some embodiments, the first component 110A and the second components 110B have the same function. Therefore, the semiconductor package assembly 300 is homogeneous integration. In some other embodiments, the function of the first component 110A is different from the function of one or more of the second components 110B. Therefore, the semiconductor package assembly 300 is heterogeneous integration.

In some embodiments, one of the first component 110A and the second components 110B is a system-on-chip (SOC) and another of the first component 110A and the second components 110B is a passive device. In some embodiments, one of the first component 110A and the second components 110B is an analog processor (AP) and another of the first component 110A and the second components 110B is a digital processor (DP). In some embodiments, one of the first component 110A and the second components 110B is a baseband (BB) component and another of the first component 110A and the second components 110B is a radio-frequency (RF) component.

For example, in some embodiments, the first component 110A is an active device while the second components 110B are passive devices with the same or different functions. In some embodiments, the first component 110A and one of the second components 110B are active devices with the same or different functions while another second component 110B is a passive device. In some other embodiments, the first component 110A and the second components 110B are active devices with various different functions.

Alternatively, in some embodiments, the first component 110A is a passive device while the second components 110B are active devices with the same or different functions. In some embodiments, the first component 110A and one of the second components 110B are passive devices with the same or different functions while another second component 110B is an active device.

Figure 4:
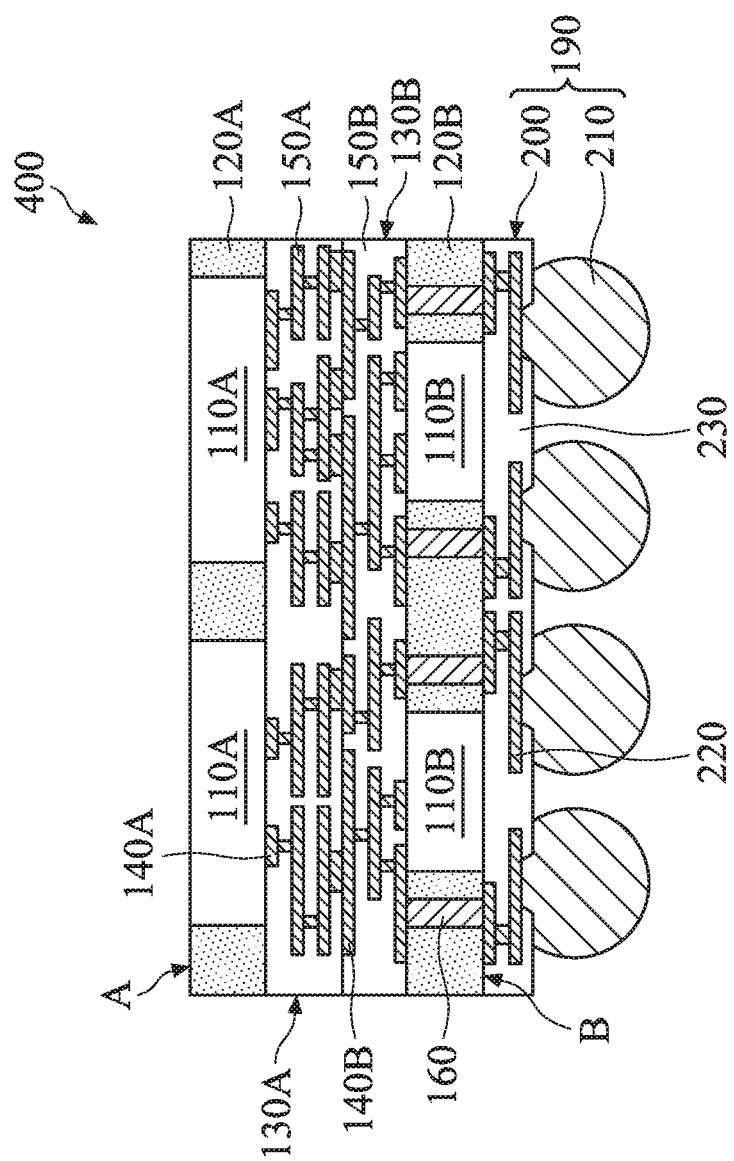
FIG. 4 is a cross-sectional view of a semiconductor package assembly, in accordance with some embodiments of the disclosure.
Figure 5:
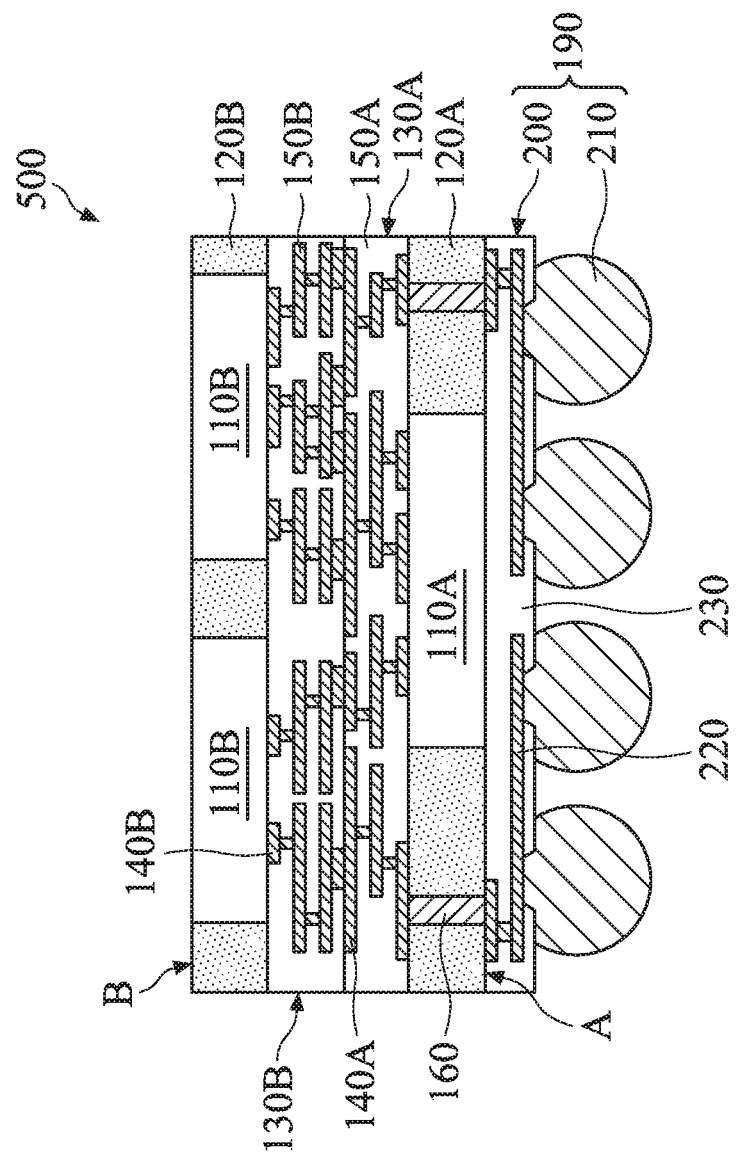
FIG. 5 is a cross-sectional view of a semiconductor package assembly, in accordance with some embodiments of the disclosure.

Many variations and/or modifications can be made to embodiments of the disclosure. FIGS. 4 and 5 are cross-sectional views of a semiconductor package assembly, in accordance with some embodiments of the disclosure. Elements in FIGS. 4 and 5 that are the same as those in FIG. 3E are labeled with the same reference numbers as in FIG. 3E and are not described again for brevity.

Referring to FIG. 4, a semiconductor package assembly 400 is shown. The semiconductor package assembly 400 is similar to the semiconductor package assembly 300 shown in FIG. 3E. The main difference between the semiconductor package assemblies 300 and 400 is that the semiconductor package assembly 300 includes one first component 110A while the semiconductor package assembly 400 includes two first components 110A. The semiconductor package assembly 400 may include more than two first components 110A.

In some embodiments, the first components 110A are the same size. In some other embodiments, the first components 110A are different sizes. In some embodiments, the size of the first components 110A is different from that of the second components 110B. For example, the size of the first components 110A is greater than that of the second components 110B. In some embodiments, the first components 110A have the same function. In some other embodiments, the first components 110A have the different functions.

Referring to FIG. 5, a semiconductor package assembly 500 is shown. The semiconductor package assembly 500 is similar to the semiconductor package assembly 300 shown in FIG. 3E. The main difference between the semiconductor package assemblies 300 and 500 is that the vias 160 of the semiconductor package assembly 300 are formed in the second package B while the vias 160 of the semiconductor package assembly 500 are formed in the first package A. As a result, the conductive component 190 of the semiconductor package assembly 300 is formed on the second package B while the conductive component 190 of the semiconductor package assembly 500 is formed on the first package A.

In FIG. 5, the vias 160 penetrate the first molding compound 120A and are electrically connected or coupled to the first RDL structure 130A. The conductive component 190 and the second package B are positioned on two opposite sides of the first package A. The first components 110A are positioned between the first RDL structure 130A and the conductive component 190.

The semiconductor package assembly and methods for forming the same in accordance with some embodiments of the disclosure provide various advantages. According to the aforementioned embodiments, more than two components or dies can be integrated in a semiconductor package assembly. These components or dies are fabricated in different processes and are known-good components or dies. Therefore, sizes and/or functions of the components or dies are not limited, thereby facilitating improvements to the flexibility of the design. The manufacturing yield of the semiconductor package assembly is significantly enhanced even further.

Furthermore, according to the aforementioned embodiments, two packages are bonded together using a fusion bonding method to form a semiconductor package assembly. There is no need to form additional bonding structures (such as conductive pillars, conductive bumps, or conductive paste structures) or an additional adhesive layer. Accordingly, the process flow of the semiconductor package assembly is simplified and the manufacturing cost is reduced.

Since the two packages are directly bonded without any intervening layer, the signal transmitting path/distance between the two packages is greatly shortened. Also, the capability of electrical migration (EM) can be further enhanced. In addition, the thickness of the semiconductor package assembly is reduced. Therefore, the device performance of the semiconductor package assembly is significantly improved.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
   a first semiconductor package, comprising:
   a first semiconductor die; and
   a first redistribution layer (RDL) structure coupled to the first semiconductor die and comprising a first conductive trace in contact with an active surface of the first semiconductor die, wherein a horizontal size of the first RDL structure is larger than a horizontal size of the first semiconductor die; and
   a second semiconductor package bonded to the first semiconductor package, wherein the second semiconductor package comprises:
   a second semiconductor die, wherein an active surface of the second semiconductor die faces the active surface of the first semiconductor die; and
   a second RDL structure coupled to the second semiconductor die and comprising a second conductive trace in contact with the active surface of the second semiconductor die, wherein the first conductive trace is in direct electrical contact with the second conductive trace without any intervening layer and the first and second conductive traces provide an electrical connection path between the active surfaces of the first and second semiconductor dies.

2. The semiconductor package assembly as claimed in claim 1, wherein the first semiconductor package comprises more than one first semiconductor die or the second semiconductor package comprises more than one second semiconductor die.

3. The semiconductor package assembly as claimed in claim 1, wherein the first conductive trace and the second conductive trace comprise copper.

4. The semiconductor package assembly as claimed in claim 3, wherein the first RDL structure further comprises a first dielectric layer surrounding the first conductive trace, and the second RDL structure further comprises a second dielectric layer surrounding the second conductive trace and in direct contact with the first dielectric layer.

5. The semiconductor package assembly as claimed in claim 1, wherein the first semiconductor die and the second semiconductor die are different sizes.

6. The semiconductor package assembly as claimed in claim 1, wherein the first semiconductor package further comprises a first molding compound, wherein the first molding compound surrounds sidewalls of the first semiconductor die.

7. The semiconductor package assembly as claimed in claim 6, wherein the first RDL structure covers the first molding compound.

8. The semiconductor package assembly as claimed in claim 6, wherein the first semiconductor package further comprises a via, wherein the via penetrates the first molding compound and is coupled to the first RDL structure.

9. The semiconductor package assembly as claimed in claim 8, further comprising a conductive component coupled to the via, wherein the first semiconductor die is positioned between the first RDL structure and the conductive component.

10. The semiconductor package assembly as claimed in claim 1, wherein the second semiconductor package further comprises a second molding compound, and the second molding compound surrounds sidewalls of the second semiconductor die.

11. The semiconductor package assembly as claimed in claim 10, wherein the second RDL structure covers the second molding compound.

12. The semiconductor package assembly as claimed in claim 10, wherein the second semiconductor package further comprises a via, wherein the via penetrates the second molding compound and is coupled to the second RDL structure.

13. The semiconductor package assembly as claimed in claim 12, further comprising a conductive component coupled to the via, wherein the second semiconductor die is positioned between the second RDL structure and the conductive component.

14. A semiconductor package assembly, comprising:
a first package, comprising:
a first component; and
a first redistribution layer (RDL) structure coupled to the first component and comprising a first conductive trace in contact with the first component, wherein a horizontal size of the first RDL structure is larger than a horizontal size of the first component; and
a second package bonded to the first package, wherein the second package comprises:
a second component; and
a second RDL structure coupled to the second component and comprising a second conductive trace in contact with the second component, wherein the first conductive trace is in direct electrical contact with the second conductive trace without any intervening layer and the first and second conductive traces provide an electrical connection path between the first and second components.

15. The semiconductor package assembly as claimed in claim 14, wherein the first component and the second component are different sizes.

16. The semiconductor package assembly as claimed in claim 14, wherein one of the first and second components is an active device, and another one of the first and second components is a passive device.

17. The semiconductor package assembly as claimed in claim 14, wherein the first package comprises more than one first component or the second package comprises more than one second component.

18. The semiconductor package assembly as claimed in claim 14, wherein the first package comprises more than one first component and the second package comprises more than one second component, and wherein at least one of the first components and one of the second components are different sizes.

19. The semiconductor package assembly as claimed in claim 14, further comprising a first molding compound and a second molding compound, wherein the first molding compound surrounds sidewalls of the first component and the second molding compound surrounds sidewalls of the second component.

20. The semiconductor package assembly as claimed in claim 19, further comprising a via, wherein the via penetrates the first or second molding compound.

21. The semiconductor package assembly as claimed in claim 20, further comprising a conductive component coupled to the via.

22. The semiconductor package assembly as claimed in claim 14, wherein the first RDL structure further comprises a first dielectric layer surrounding the first conductive trace, and the second RDL structure further comprises a second dielectric layer surrounding the second conductive trace and in direct contact with the first dielectric layer.

* * * * *